US010636778B2

(12) United States Patent
Male et al.

(10) Patent No.: US 10,636,778 B2
(45) Date of Patent: Apr. 28, 2020

(54) ISOLATOR INTEGRATED CIRCUITS WITH PACKAGE STRUCTURE CAVITY AND FABRICATION METHODS

(71) Applicant: TEXAS INSTRUMENTS INCORPORATED, Dallas, TX (US)

(72) Inventors: Barry Jon Male, West Granby, CT (US); Benjamin Stassen Cook, Addison, TX (US); Robert Alan Neidorff, Bedford, NH (US); Steve Kummerl, Carrolton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/126,577

(22) Filed: Sep. 10, 2018

(65) Prior Publication Data

US 2019/0006338 A1    Jan. 3, 2019

Related U.S. Application Data

(62) Division of application No. 15/395,584, filed on Dec. 30, 2016, now Pat. No. 10,074,639.

(51) Int. Cl.
*H01L 23/31* (2006.01)
*H01L 49/02* (2006.01)
(Continued)

(52) U.S. Cl.
CPC .......... *H01L 25/167* (2013.01); *H01F 38/14* (2013.01); *H01L 23/315* (2013.01); *H01L 23/49* (2013.01);
(Continued)

(58) Field of Classification Search
CPC ............................. H04B 5/005; H01L 23/315
See application file for complete search history.

(56) References Cited

U.S. PATENT DOCUMENTS 3,508,126 A    4/1970  Newman
3,952,265 A    4/1976  Hunsperger
(Continued)

FOREIGN PATENT DOCUMENTS

EP    1986297 A2    10/2008
EP    2490263 A2    8/2010
(Continued)

OTHER PUBLICATIONS

European Search Report for 17796774.2 dated May 9, 2019.
(Continued)

*Primary Examiner* — Daniel Luke
(74) *Attorney, Agent, or Firm* — Michael A. Davis, Jr.; Charles A. Brill; Frank D. Cimino

(57) ABSTRACT

In described examples, an integrated circuit includes a leadframe structure, which includes electrical conductors. A first coil structure is electrically connected to a first pair of the electrical conductors of the leadframe structure. The first coil structure is partially formed on a semiconductor die structure. A second coil structure is electrically connected to a second pair of the electrical conductors of the leadframe structure. The second coil structure is partially formed on the semiconductor die structure. A molded package structure encloses portions of the leadframe structure. The molded package structure exposes portions of the first and second pairs of the electrical conductors to allow external connection to the first and second coil structures. The molded package structure includes a cavity to magnetically couple portions of the first and second coil structures.

8 Claims, 18 Drawing Sheets

(51) Int. Cl.
*H01L 23/495* (2006.01)
*H01L 25/16* (2006.01)
*H01L 31/0203* (2014.01)
*H01L 31/101* (2006.01)
*H01F 38/14* (2006.01)
*H01L 23/49* (2006.01)
*H01L 31/02* (2006.01)
*H01L 31/103* (2006.01)
*H01L 31/11* (2006.01)
*H01L 31/167* (2006.01)
*H01L 33/62* (2010.01)
*H04B 10/80* (2013.01)
*H01L 33/00* (2010.01)
*H01L 33/60* (2010.01)
*H01L 23/00* (2006.01)

(52) U.S. Cl.
CPC ........ *H01L 23/49575* (2013.01); *H01L 28/10* (2013.01); *H01L 31/0203* (2013.01); *H01L 31/02005* (2013.01); *H01L 31/101* (2013.01); *H01L 31/103* (2013.01); *H01L 31/1105* (2013.01); *H01L 31/167* (2013.01); *H01L 33/00* (2013.01); *H01L 33/62* (2013.01); *H04B 10/803* (2013.01); *H01L 24/08* (2013.01); *H01L 24/48* (2013.01); *H01L 24/85* (2013.01); *H01L 33/60* (2013.01); *H01L 2224/08113* (2013.01); *H01L 2224/48091* (2013.01); *H01L 2224/48149* (2013.01); *H01L 2224/48245* (2013.01); *H01L 2224/48247* (2013.01); *H01L 2924/00014* (2013.01); *H01L 2924/12041* (2013.01); *H01L 2924/12043* (2013.01)

(56) References Cited

U.S. PATENT DOCUMENTS

| | | |
|---|---|---|
| 4,007,978 A | 2/1977 | Holton |
| 4,210,923 A | 7/1980 | North et al. |
| 4,267,484 A | 5/1981 | O'Loughlin |
| 4,272,753 A | 6/1981 | Nicolay |
| 4,303,934 A | 12/1981 | Stitt |
| 4,757,210 A | 7/1988 | Bharat et al. |
| 4,891,730 A | 1/1990 | Saddow et al. |
| 4,916,506 A | 4/1990 | Gagnon |
| 4,942,456 A | 7/1990 | Sako |
| 4,996,577 A | 2/1991 | Kinzer |
| 5,340,993 A | 8/1994 | Salina et al. |
| 5,389,578 A | 2/1995 | Hodson et al. |
| 5,514,892 A | 5/1996 | Countryman et al. |
| 5,629,838 A | 5/1997 | Knight |
| 5,796,570 A | 8/1998 | Mekdhanasam |
| 5,929,514 A | 7/1999 | Yalamanchili |
| 5,990,519 A | 11/1999 | Huang-Lu et al. |
| 6,031,251 A | 2/2000 | Gempe et al. |
| 6,111,305 A | 8/2000 | Yoshida et al. |
| 6,242,987 B1 | 6/2001 | Schopf et al. |
| 6,351,011 B1 | 2/2002 | Whitney et al. |
| 6,365,433 B1 | 4/2002 | Hyoudo et al. |
| 6,507,264 B1 | 1/2003 | Whitney |
| 6,509,574 B2 | 1/2003 | Yuan et al. |
| 6,696,752 B2 | 2/2004 | Su et al. |
| 6,815,808 B2 | 11/2004 | Hyodo et al. |
| 6,821,822 B1 | 11/2004 | Sato |
| 6,921,704 B1 | 7/2005 | Wu et al. |
| 6,977,468 B1 | 12/2005 | Baginski |
| 7,015,587 B1 | 3/2006 | Poddar |
| 7,321,162 B1 | 1/2008 | Lee et al. |
| 7,732,892 B2 | 6/2010 | Jeng et al. |
| 7,749,797 B2 | 7/2010 | Bauer et al. |
| 7,842,542 B2 | 11/2010 | Shim et al. |
| 7,869,180 B2 | 1/2011 | Cheung et al. |
| 8,018,705 B2 | 9/2011 | Michalopoulos et al. |
| 8,433,084 B2 | 4/2013 | Conti |
| 8,436,460 B1 | 5/2013 | Gamboa et al. |
| 8,569,082 B2 | 10/2013 | Kummerl et al. |
| 8,633,551 B1 | 1/2014 | Teh et al. |
| 9,160,423 B2 * | 10/2015 | Brauchler ............... H01L 24/49 |
| 9,184,012 B2 | 11/2015 | Wang |
| 9,219,028 B1 * | 12/2015 | Higgins, III ........ H01L 23/5389 |
| 9,419,075 B1 | 8/2016 | Carothers et al. |
| 9,748,207 B2 | 8/2017 | Krause et al. |
| 9,761,543 B1 * | 9/2017 | Male ....................... H01L 23/38 |
| 9,929,110 B1 | 3/2018 | Male et al. |
| 2003/0183916 A1 | 10/2003 | Heck et al. |
| 2003/0222205 A1 | 12/2003 | Shoji |
| 2004/0080025 A1 | 4/2004 | Kasahara et al. |
| 2004/0084729 A1 | 5/2004 | Leung et al. |
| 2004/0111881 A1 | 6/2004 | Yang et al. |
| 2005/0218300 A1 | 10/2005 | Quinones et al. |
| 2005/0221517 A1 | 10/2005 | Speyer et al. |
| 2006/0087000 A1 | 4/2006 | Okuno |
| 2006/0205106 A1 | 9/2006 | Fukuda |
| 2006/0281334 A1 | 12/2006 | Shin et al. |
| 2007/0076421 A1 | 4/2007 | Kogo |
| 2007/0152308 A1 | 7/2007 | Ha et al. |
| 2007/0229177 A1 | 10/2007 | Moriya |
| 2007/0278897 A1 | 12/2007 | Ozaki |
| 2008/0217759 A1 | 9/2008 | Lin et al. |
| 2008/0266730 A1 | 10/2008 | Viborg et al. |
| 2008/0290486 A1 | 11/2008 | Chen et al. |
| 2009/0052214 A1 | 2/2009 | Edo et al. |
| 2009/0085191 A1 | 4/2009 | Najafi et al. |
| 2009/0115049 A1 | 5/2009 | Shiraishi et al. |
| 2009/0127638 A1 | 5/2009 | Kilger et al. |
| 2010/0187652 A1 | 7/2010 | Yang |
| 2010/0244234 A1 | 9/2010 | Sonobe et al. |
| 2010/0252923 A1 | 10/2010 | Watanabe et al. |
| 2011/0084340 A1 | 4/2011 | Yuan et al. |
| 2011/0089540 A1 | 4/2011 | Drost et al. |
| 2011/0102005 A1 | 5/2011 | Feng et al. |
| 2011/0108747 A1 | 5/2011 | Liu |
| 2011/0220996 A1 | 9/2011 | Kutsukake et al. |
| 2011/0233790 A1 | 9/2011 | Bchir |
| 2013/0134445 A1 | 5/2013 | Tarsa |
| 2013/0194057 A1 | 8/2013 | Ruby |
| 2013/0315533 A1 | 11/2013 | Tay et al. |
| 2013/0320459 A1 | 12/2013 | Shue et al. |
| 2013/0320548 A1 | 12/2013 | Carpenter et al. |
| 2013/0329324 A1 | 12/2013 | Tziviskos et al. |
| 2013/0336613 A1 | 12/2013 | Meade et al. |
| 2014/0001632 A1 | 1/2014 | Uehling et al. |
| 2014/0061840 A1 | 3/2014 | Oguri et al. |
| 2014/0091909 A1 | 4/2014 | Smith et al. |
| 2014/0264905 A1 | 9/2014 | Lee et al. |
| 2015/0004902 A1 * | 1/2015 | Pigott .................... H01L 28/10 455/41.1 |
| 2015/0035091 A1 | 2/2015 | Ziglioli |
| 2015/0069537 A1 | 3/2015 | Lo et al. |
| 2015/0249043 A1 | 9/2015 | Elian |
| 2015/0255693 A1 | 9/2015 | Baade et al. |
| 2015/0369681 A1 | 12/2015 | Imai |
| 2015/0369682 A1 | 12/2015 | Nakajima |
| 2015/0372034 A1 | 12/2015 | Chen et al. |
| 2015/0380353 A1 | 12/2015 | Bauer et al. |
| 2016/0003436 A1 | 1/2016 | Singer |
| 2016/0064696 A1 | 3/2016 | Collier et al. |
| 2016/0087034 A1 | 3/2016 | You et al. |
| 2016/0103082 A1 | 4/2016 | Kimura |
| 2016/0167089 A1 | 6/2016 | Ng |
| 2016/0209285 A1 | 7/2016 | Nakajima |
| 2017/0047271 A1 | 2/2017 | Zapico |
| 2017/0089789 A1 | 3/2017 | Kanemoto |

(56) References Cited

U.S. PATENT DOCUMENTS

2017/0134004 A1 5/2017 Isozaki
2017/0330841 A1 11/2017 Cook et al.

FOREIGN PATENT DOCUMENTS

| GB | 2521619 | | 1/2015 |
|---|---|---|---|
| RU | 2169962 | C2 | 6/2001 |
| RU | 2201017 | C2 | 3/2003 |
| RU | 2263999 | A | 7/2005 |

OTHER PUBLICATIONS

Cameron G. Clark, "The Basics of Arc Flash," GE Industrial Solutions web site accessed Oct. 5, 2016, http://apps.geindustrial.com/publibrary/checkout/ArcFlash4?TNR=White%20Papers%7CArcFlash4%7Cgeneric (3 pages).

National Semiconductor Corporation, "Semiconductor Packaging Assembly Technology," National Semiconductor Corporation, Aug. 1999, pp. 1-8.

Maloberti, F., "Layout of Analog CMOS Integrated Circuit, Part 2 Transistors and Basic Cells Layout," retrieved from http://ims.unipv.it/Courses/download/AIC/Layout02.pdf, dated Mar. 15, 2004 (38 pages).

Texas Instruments Product Brochure ISO7841x High-Performance, 8000-Vpk Reinforced Quad-Channel Digital Isolator, dated Nov. 2014 (37 pages).

Texas Instruments Application Report "The ISO72x Family of High-Speed Digital Isolators," SLLA198—Jan. 2006 (12 pages).

Texas Instruments Developers Guide "Digital Isolator Design Guide," SLLA284A, Jan. 2009 (19 pages).

Wikipedia article "3D Printing," retrieved from "http://en.wikipedia.org/w/index.php?title=3D_printing&oldid=624190184", dated Sep. 4, 2014 (35 pages).

OSRAM Opto Semiconductors GmbH, Oslon Compact (850nm), version 1.6, SFH 4710, dated Dec. 1, 2015 (13 pages).

International Search Report for PCT/US2017/031987 dated Sep. 7, 2017.

International Search Report for PCT/US2017/068983 dated May 17, 2018.

International Search Report for PCT/US2017/068997 dated May 24, 2018.

Extended European Search Report for 17886649.7 dated Jan. 8, 2020.

* cited by examiner

ISOLATOR INTEGRATED CIRCUITS WITH PACKAGE STRUCTURE CAVITY AND FABRICATION METHODS

CROSS-REFERENCE TO RELATED APPLICATIONS

This application is a divisional of U.S. patent application Ser. No. 15/395,584 filed Dec. 30, 2016, which is incorporated herein by reference.

BACKGROUND

Isolation products are used to provide electrical isolation to transfer signals between circuits of different voltage levels and/or between circuits that operate from different supply voltages and ground references. One type of isolator is called an opto-isolator or opto-coupler that provides an optical transmission path to transfer signals between circuits that can be electrically isolated from one another. Opto isolators are used in data communication, power supplies, and other systems where high voltage or high slew-rate common-mode signals appear between the input and output. Opto-isolators are often constructed as a transmitter and a receiver separated by glass and packaged together. Glass provides dc electrical isolation and optical transmission, but suffers from capacitive coupling between the transmitter and receiver and also adds cost to the device. Transformers provide isolation between magnetically coupled primary and secondary coils separated by an insulator to transfer data and/or power between two circuits that are separated by a high voltage or high slew-rate common-mode signal. Some transformers include a magnetic coupling material to enhance the magnetic coupling between the primary and secondary.

SUMMARY

In described examples, an integrated circuit includes a leadframe structure, which includes electrical conductors. A first coil structure is electrically connected to a first pair of the electrical conductors of the leadframe structure. The first coil structure is partially formed on a semiconductor die structure. A second coil structure is electrically connected to a second pair of the electrical conductors of the leadframe structure. The second coil structure is partially formed on the semiconductor die structure. A molded package structure encloses portions of the leadframe structure. The molded package structure exposes portions of the first and second pairs of the electrical conductors to allow external connection to the first and second coil structures. The molded package structure includes a cavity to magnetically couple portions of the first and second coil structures.

DETAILED DESCRIPTION

Figure 1:
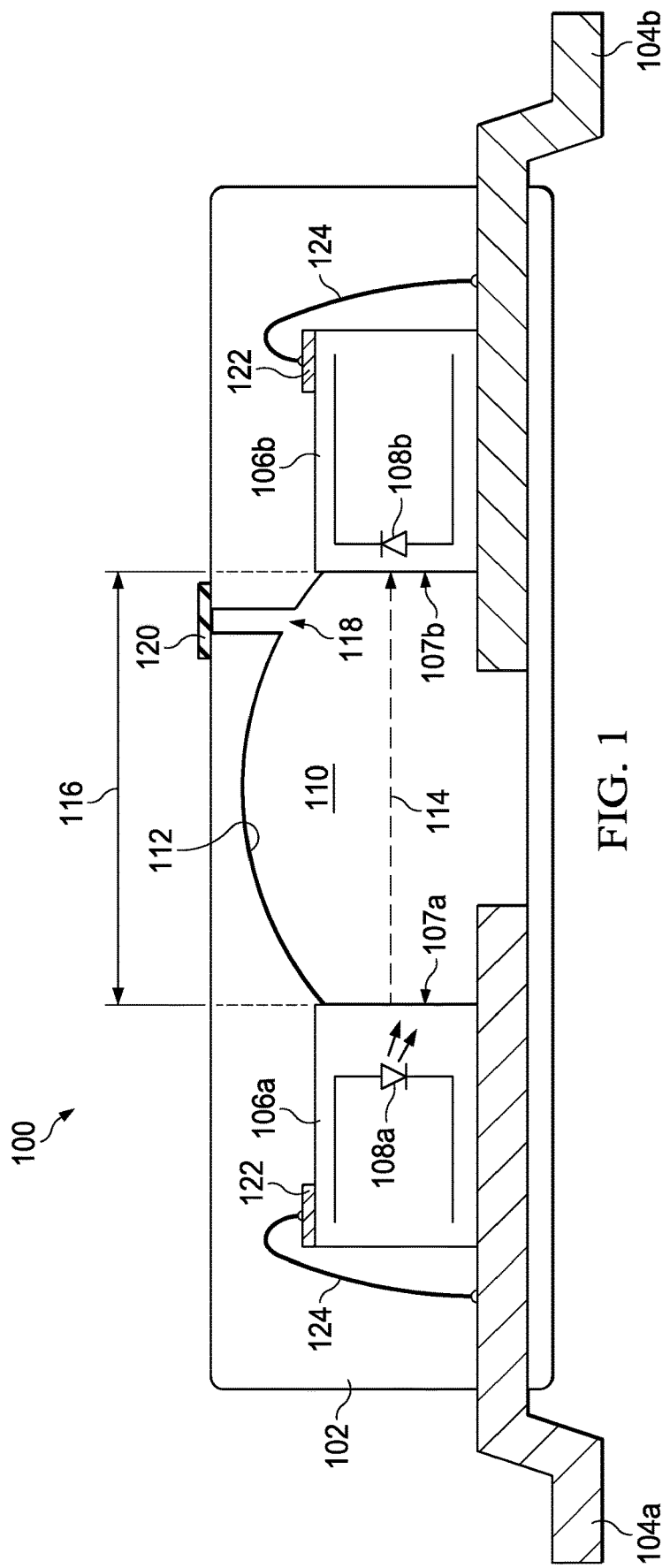
FIG. 1 is a sectional side elevation view of an optical isolation integrated circuit including an LED light source and a photo receptor diode sensor in spaced semiconductor dies in an internal cavity of a molded package structure providing an optical path for electrical isolation according to an embodiment.

In the drawings, like reference numerals refer to like elements throughout, and the various features are not necessarily drawn to scale. In this description, the terms "couple," "coupled" and "couples" include indirect or direct electrical or mechanical connection or combinations thereof. For example, if a first device couples to or is coupled with a second device, that connection may be through a direct electrical connection, or through an indirect electrical connection via one or more intervening devices and connections.

Figure 2:
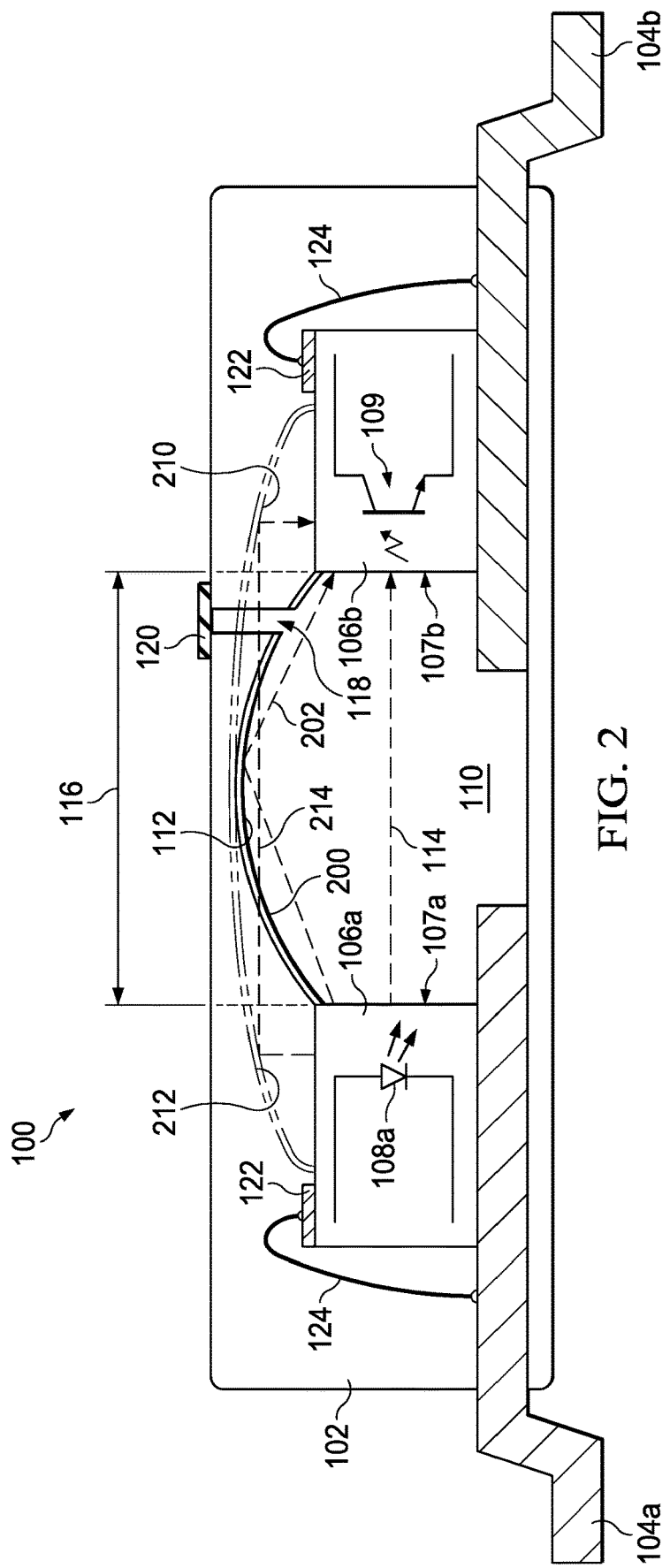
FIG. 2 is a sectional side elevation view of another optical isolation IC embodiment with an LED light source and a bipolar transistor sensor, including a reflective coating formed on a concave surface of the package cavity.

FIG. 1 shows an example optical isolation integrated circuit (IC) 100, such as an opto-isolator or opto-coupler device. The IC 100 includes a light source 108a configured to generate a light signal along an optical path 114. In one example, the light source is an LED fabricated in a first semiconductor die or other circuit structure 106a, although lasers or other optical sources can be used in other embodiments. The IC 100 further includes a second device or circuit structure 106b including a light sensor 108b facing the optical path 114 to receive the light signal. In one example, the light sensor 108b is a photo receptor diode sensor as schematically illustrated in FIG. 1. Any suitable light sensor can be used, which receives the light signal from the source 108a. FIG. 2 illustrates another possible implementation, in which the second circuit structure 106b includes a bipolar transistor 109 that senses the received light signal. As shown in FIG. 1, the circuit structures 106a and 106b individually include bond pads 122 connected by bond wires 124 to corresponding electrical conductors 104a, 104b of the lead frame structure. In one example shown in FIG. 3, the first circuit structure 106a includes first and second bond pads 122 individually connected to a pair of corresponding first pair of the electrical conductors 104a-1, 104a-2 of the leadframe structure. The conductors 104a-1 and 104a-2 in one example are IC pins or pads that can be soldered to a host printed circuit board (PCB, not shown). In this example, an external circuit (not shown) provides a signal to the light source 108a via the conductors 104a-1 and 104a-2, and the light source 108a generates the light signal in response. In this example, the second circuit structure 106b also include bond pads 122 that are electrically connected by corresponding bond wires 124 to a second pair of leadframe electrical conductors 104b-1 and 104b-2. The conductors 104b-1 and 104b-2 in the illustrated examples provide pads or pins of the IC 100 that can be soldered to a host PCB to deliver a signal from the sensor 108b that is isolated from the source signal at the conductors 104a-1 and 104a-2. In this manner, the spacing 116 of the circuit structures 106a and 106b provides electrical isolation, with signal transmission along the path 114 through the cavity 110 of the IC 100.

The optical source 108a and sensor 108b are spaced from one another in an internal cavity 110 of a molded package structure 102 to provide electrical isolation therebetween according to an embodiment. The cavity 110 provides an optical path 114 that is free of solids (i.e., solid free). The conventional use of glass or other optically transmissive solid structure adds cost to optical isolation devices, and adds to the capacitance of the source/sensor configuration. The capacitance of devices using solid transmission media presents problems, particularly for high speed data communications and high common-mode slew rate rejection, and the manufacturing cost is prohibitive for many applications. Also, the solid transmission media also presents issues with degradation of optical performance over time. The described opto-coupler IC 100, in contrast, advantageously reduces the coupling capacitance and cost while facilitating any desired level of electrical isolation and high breakdown voltage. In this regard, air has a much lower dielectric constant than glass or other transparent materials, and the described examples reduce capacitive coupling between the optical sensor and transmitter. Also, the solid-free gap 116 between the source and sensor dies 106a and 106b can be controlled by the structural relative positioning thereof to provide a desired spacing or gap distance 116 for optical transmission along the path 114 with any desired voltage isolation rating. The gap distance 116 can be controlled by the deposited sacrificial sublimation material in one example. The gap 116 in some examples is controlled by mechanical features on one of the dies 106, such as oxide bumps (not shown) extending between the dies 106 to set the gap distance 116. The gap 116 is controlled in some examples by mixing filler material of a particular size with the sacrificial material. In other embodiments, the sublimation region can be formed as a unique printed shape using inkjet printing technology, and the optical channel can be directly printed.

Figure 3:
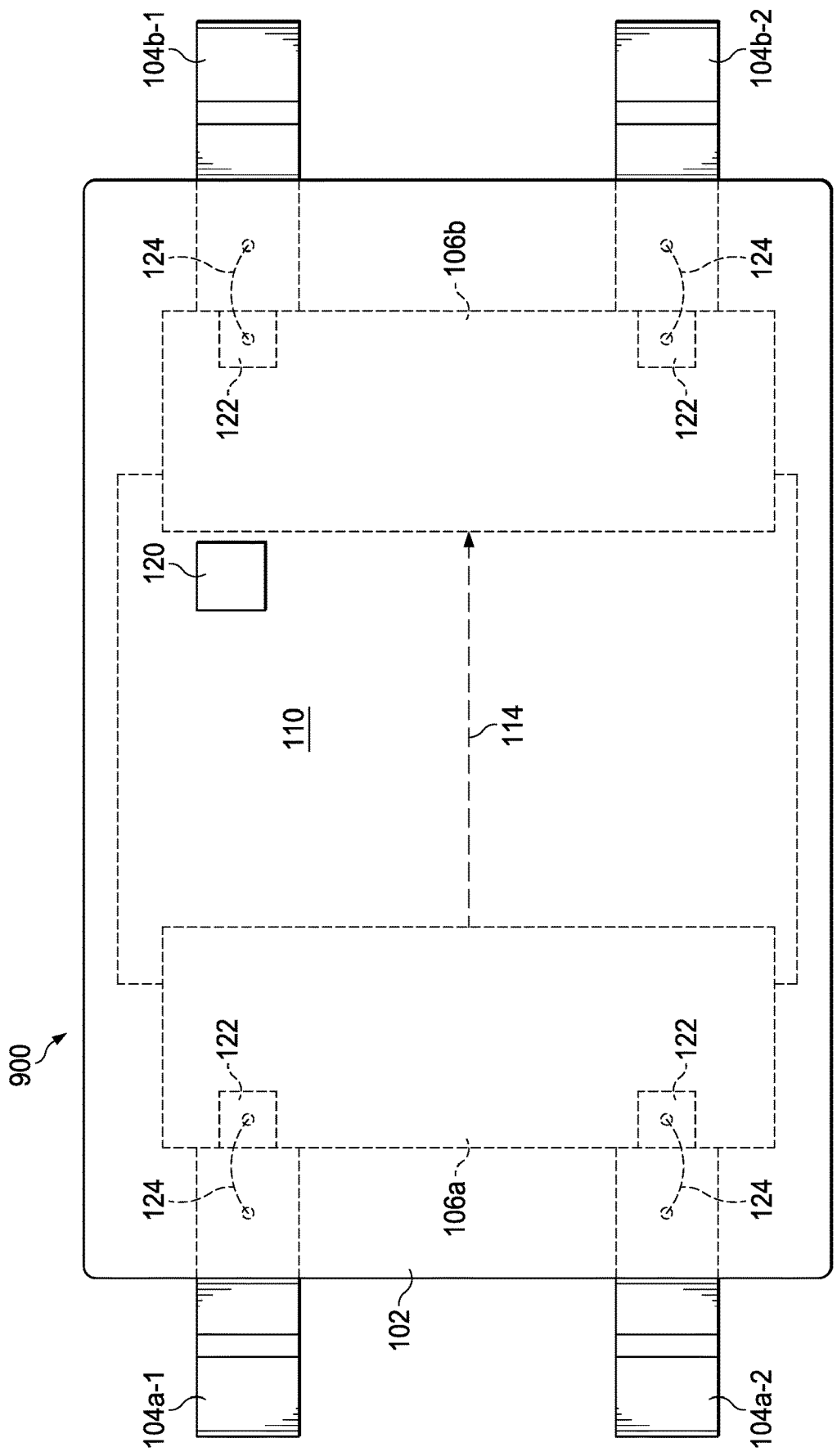
FIG. 3 is a top plan view of the optical isolation IC of FIG. 1.

The light sensor 108b at least partially faces the light source 108a to receive the light signal. In the examples of FIGS. 1-3, the first circuit structure 106a includes a light source signal output face or side 107a, and the second circuit structure 106b includes a sensor face or side 107b, where the signal output face 107a and the sensor face 107b lie in generally parallel planes, spaced from one another by the distance 116 in the cavity 110. In other possible examples, the faces 107 need not be parallel. Any relative configuration can be used in which the sensor face 107b at least partially faces the light source 108a so as to receive the light signal. The sensor face 107b allows light to enter the structure 106b so as to modify the electrical behavior of the sensor, whether a diode 108b or a transistor 109 or other light sensor structure, to generate a sensor signal to be output or further processed by the second circuit structure 106b. The circuit 106b may include further interface circuitry (not shown) to operate on the sensor signal. Moreover, as shown in FIGS. 1 and 2, significant portions of the faces 107a and 107b are exposed within the cavity 110, although not a strict requirement of all possible embodiments.

The IC 100 in FIGS. 1-3 also includes a molded package structure 102 that encloses portions of the leadframe structure 104 and portions of the circuit structures 106a and 106b. In other examples, the package structure material 102 need not enclose the circuit structures 106a and 106b. The package structure 102 exposes portions of the electrical conductors 104a-1, 104a-2, 104b-1 and 104b-2 to allow external connection to the first and second circuit structures 106a and 106b. In the illustrated implementations, the package structure 102 is a molded material structure that includes the cavity 110, and the optical signal path 114 extends within the cavity 110 between the light source 108a and the light sensor 108b, 109 of the circuit structures 106a, 106b. The cavity 110 thus provides a solid-free optical path 114 for the light signal between the circuit structures 106a and 106b. The illustrated structure further includes a port 118 extending from the cavity 110 to the exterior of the package structure 102, and a cover or seal structure 120 that seals the cavity 110 from the IC exterior. The port 118 can be in the upper portion of the cavity 110 as illustrated, or the cavity can be ported through the side, or through the bottom, or combinations thereof.

The cavity 110 is defined by an interior surface 112 of the package structure 102. The interior surface 112 can be of any suitable shape and profile. In some examples, the interior surface 112 enhances optical transmission in the cavity. The interior surface 112 of the package structure 102 includes a concave portion in the embodiments of FIGS. 1 and 2. In this example, the concave surface can be provided by forming a sacrificial material during fabrication as a drop or one or more drops, such as using a printing process. This deposited sacrificial material thus forms a partially convex structure, and the material is later sublimated or evaporated after formation of the molded package structure material 102, leaving a concave inner surface.

In the example of FIG. 2, the concave portion of the interior surface includes a reflective coating 200 that reflects light from the light source 108a toward the light sensor 108b, 109. The reflective coating material 200 in one example is deposited over the convex sacrificial sublimation material before the molding process that creates the molded package structure material 102. Sublimation of the sacrificial material layer after the molding process leaves the cavity 110 defined at least part by the concave surface of the remaining reflective material layer 200. Any suitable non-conductive material 200 can be used which facilitates reflection of all or part of the light signal generated by the light source 108a toward the light sensor 108b, 109. As shown in FIG. 2, the light signal from the source 108a can travel through the cavity 110 along the optical path 114 directly to the sensing face 107b of the sensor die 106b, and/or the signal can also travel along a reflected path 202 via the reflective coating 200 on the concave surface.

In other examples, a concave surface 210, 212 can be formed (shown in dashed line form in FIG. 2) that extends laterally outward to expose top portions of one or both of the source and sensor circuit structures 106a and 106b. In one implementation, the concave surface 212 includes a reflective coating material 210. These embodiments can include an LED or other light source circuit 106a having an emissive upper or top surface that emits light toward the reflective coating material 210 and the light signal reflects one or more times to impart a side and/or top sensing face of the sensor circuit 106b. As used herein, a sensing face of the circuit 106 at least partially faces a light source circuit directly or via one or more reflective surfaces (e.g., surfaces 200, 210) of a concave or flat surface of the cavity 110. In some embodiments, top and/or side emitting source circuits 106a can be used in combination with top and/or side sensing circuits 106b for transfer of an optical signal directly (e.g., the optical path 114 of FIGS. 1 and 2) or with one or more reflections (e.g., the reflected paths 202, 214 of FIG. 2).

The package structure 102 can be formed by molding or other suitable process, preferably using an electrical insulator material. Described examples use a sublimation process to provide low-cost isolation devices using the cavity 110 that includes at least a portion of the isolation barrier between the source and sensor circuit structures 106a and 106b. The circuit structures 106 are at least partially encapsulated in a deposited sacrificial sublimation material during fabrication, and then further encapsulated by the molded package structure material 102. The structure is then baked to sublimate (e.g., evaporate) the sacrificial material, leaving the internal cavity 110 in which the dies 106a and 106b, or at least a portion thereof, are not touching the mold compound 102. The opening 118 in some examples is drilled or cast into the package structure 102 such that the sacrificial material can be sublimated, and thereafter the seal structure 120 is provided over the top of the opening 118 to seal the cavity 110. The opening 118 can be cast into the package structure 102 via a mold sprue, or the opening 118 can be incorporated into the package before the molding process via a disposable plug, or drilled into the package 102 after molding using mechanical drilling, laser drilling, etching or other techniques.

The described structure advantageously facilitates small package size, mitigation of the cost and manufacturing difficulties associated with insertion of glass or other transparent material in the optical path of an optical isolation device. Furthermore, the described examples mitigate the capacitance and aging problems associated with glass or other solid materials in the optical path of an opto-isolator, and thus provide enhanced performance particularly for high speed communications applications. Also, the described examples can be fabricated using ordinary mainstream manufacturing processing steps and equipment.

In some examples, the dies 106 individually include a substrate, such as silicon, SOI, or other semiconductor substrate. The light source 108a and the light sensor 108b, 109 and various interface circuitry can be formed on or in the associated substrate using known semiconductor fabrication processes and equipment. The package structure 102 in one example is a molded structure. The package structure 102 can be any suitable molding material that provides electrical insulation and mechanical protection for the dies 106, and can include low modulus of elasticity material to enhance stress immunity. Moreover, the dies 106 can be supported in any suitable manner within the cavity 110, such as mounting onto a lead frame structure as shown. Thereafter, sacrificial material is deposited at least partially over the dies 106 before molding. Following molding or other formation of the packaging material 102, the assembly is heated to cause sublimation of the sacrificial encapsulant material through the port 118 of the molding material structure 102. Suitable fabrication processes and materials are illustrated and described in U.S. patent application Ser. No. 15/248,151, filed Aug. 26, 2016, and entitled "Floating Die Package," the entirety of which is hereby incorporated by reference.

Figure 4:
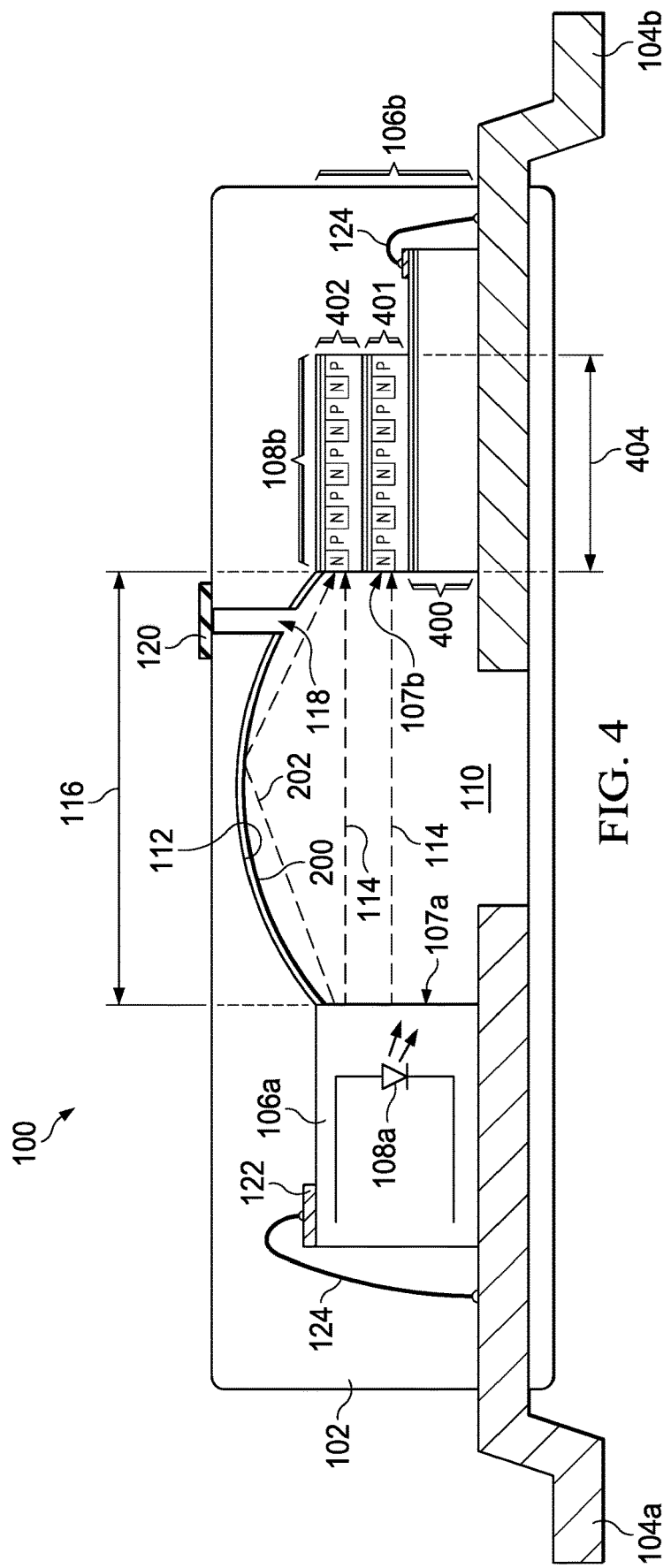
FIG. 4 is a sectional side elevation view of another optical isolation IC embodiment including horizontal diodes forming an optical sensor circuit.
Figure 5:
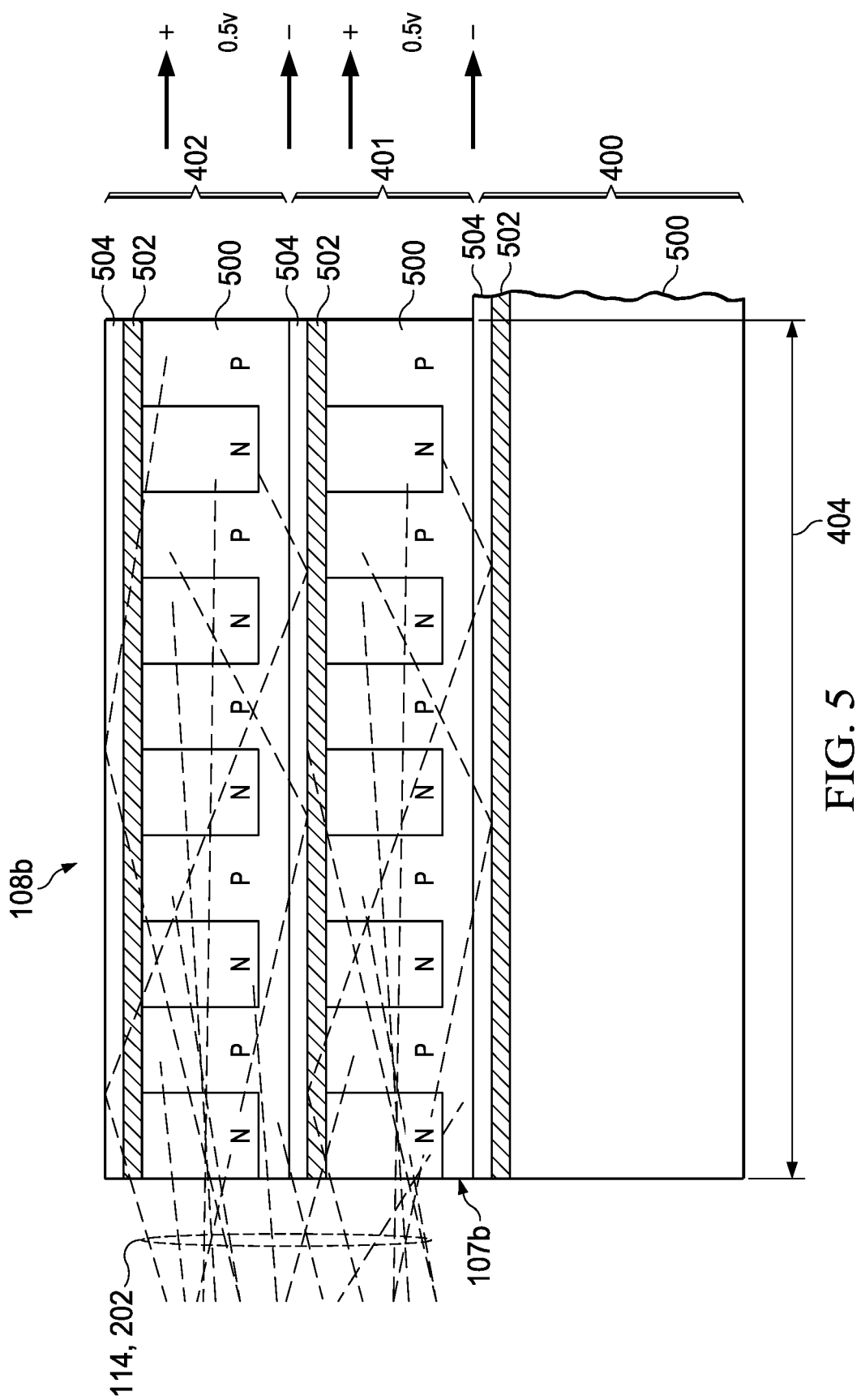
FIG. 5 is a partial sectional side elevation view showing optical reception in the embodiment of FIG. 4.

Referring also to FIGS. 4 and 5, FIG. 4 shows another optical isolation IC embodiment 100. In this example, the light sensor 108b includes connected diodes, each including N and P doped regions of a substrate. The second circuit structure 106b in this example includes five parallel-connected horizontal diodes in each of two (e.g., lower and upper) substrates or dies 401 and 402, although any number 1 or more such stacked dies can be used. FIG. 5 illustrates lateral photon absorption along the length of pn junctions in multiple stacked dies 401 and 402. The N and P regions in this embodiment are arranged generally along the optical path 114, with N regions or wells formed in a p doped substrate leaving a p region underlying the N wells to form multiple diodes connected in parallel with one another. In this example, the circuit structure 106b includes a base die 400 with a semiconductor substrate including any desired amplifiers, filters or other interface circuits (not shown). The dies 401 and 402 are back-ground in one example to have a smaller vertical height than the base die 400. As shown in FIG. 5, the base die 400 also includes a metallization structure with one or more inter-metal dielectric (IMD) structures (e.g., dielectric layers and conductive metal structures for circuit interconnections) and an upper passivation layer, and one or more die pads with bond wire connection(s) 124 to the associated leadframe electrical conductor(s) 104b. The individual dies 401 and 402 in this example include a base substrate 500 (e.g., silicon) doped through implantation of corresponding dopants in the illustrated N and P regions, a metallization structure 502 and an upper passivation layer 504. The circuit structure 106b includes any suitable intervening electrical conductor structures (not shown) to interconnect the diodes of the stacked dies 401 and 402 with the circuits and connections of the base die 400 to provide a sensor or receiver output signal to an external circuit via the associated leadframe conductors 104b.

FIG. 5 shows optical reception in the stacked dies 401 and 402 of FIG. 4. Examples of direct and reflected optical paths 114 and 202 are shown entering the dual horizontal die stack structure 401, 402 at the sensing face 107b. The use of stacked PN junctions and extended lateral optical transmission (e.g., left to right in FIG. 5) provides greater opportunity for the light signal to produce an output signal in the diode structure 108b. The described examples thus facilitate high output signal performance in the lateral optically-coupled isolation IC 100, and mitigate low signal shortcomings of conventional opto-isolators. In one example, the individual dies 401 and 402 each generate a voltage signal of approximately 0.5 V, and the stacked dies 401 and 402 can be interconnected in parallel and/or in series via metallization structure interconnections for enhanced output signal strength. In this regard, embodiments having more than 2 stacked dies can be interconnected in any desired series and/or parallel configuration to achieve a desired output signal level in response to the light signal from the light source 108a.

Figure 6:
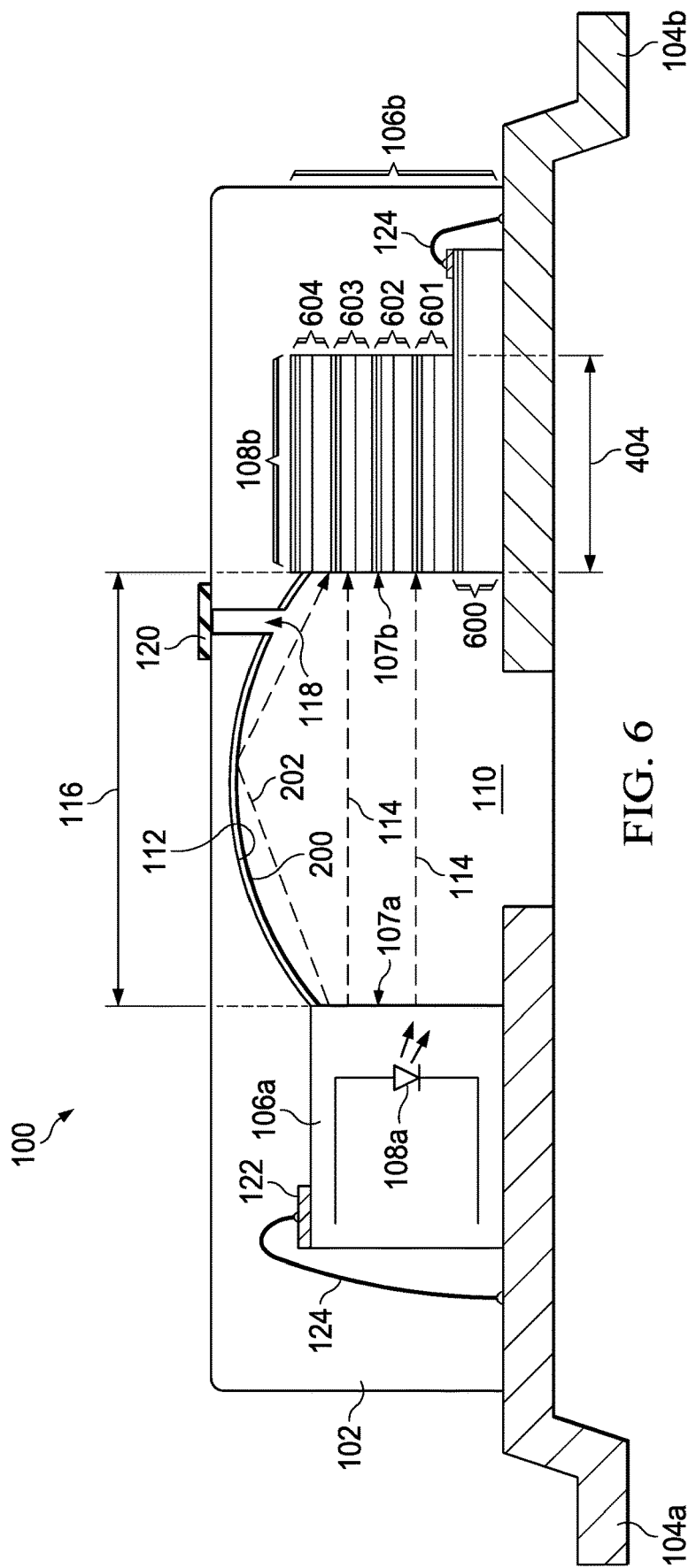
FIG. 6 is a sectional side elevation view of another optical isolation IC embodiment including vertical diodes forming an optical sensor circuit.
Figure 7:
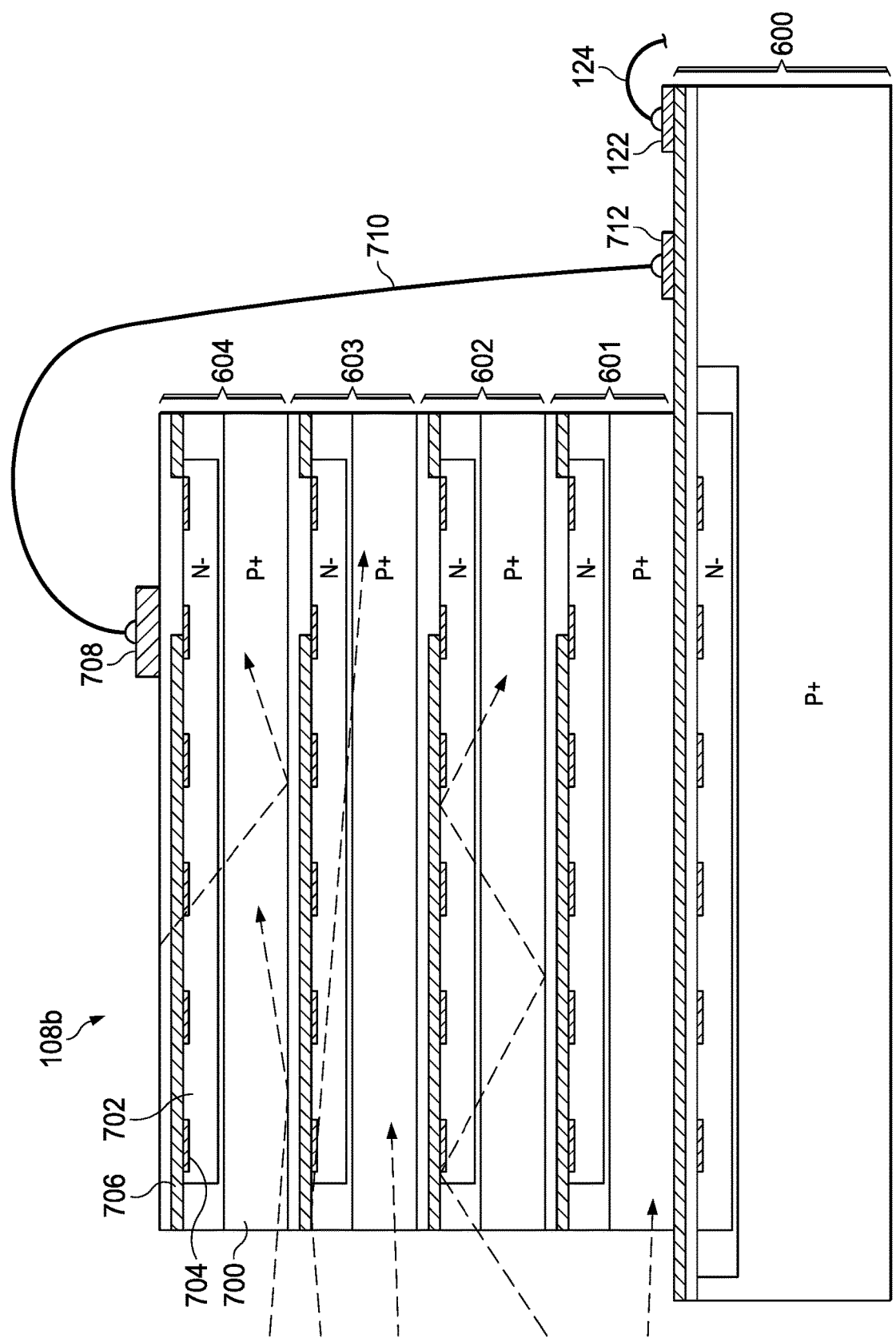
FIG. 7 is a partial sectional side elevation view showing optical reception in the embodiment of FIG. 6.

FIGS. 6 and 7 show another isolation IC example 100 using multiple stacked diodes in the optical sensor 108b. The second circuit structure 106b in FIG. 6 is a multi-die structure with vertical diodes which form an optical sensor circuit 108b. This circuit structure 106b includes four stacked dies 601, 602, 603 and 604 formed on a base die 600 to provide the circuit structure 106b. FIG. 7 shows further details of the sensor circuit 108b, where the base die 600 includes a semiconductor substrate with any desired amplifiers, filters or other interface circuits (not shown), and a metallization structure with one or more IMD structures and an upper passivation layer, and one or more die pads 122 with bond wire connection(s) 124 to the associated leadframe electrical conductor(s) 104b. The individual dies 601-604 include a base substrate 700 (e.g., silicon) with a bottom portion doped with P type dopants (e.g., boron, designated P+ in FIG. 7) and an upper portion 702 doped with N type dopants (e.g., phosphorus, designated N−) to form a vertically oriented diode. The N and P regions of the dies 601-604 in this example are thus arranged normal to the optical path 114. The individual dies 601-604 also include contacts 704 and an IMD/metallization structure 706 with any associated passivation layer. The upper die 604 in this example includes a die pad 708 connected by a bond wire 710 to a die pad 712 of the base die 600. As with the above example, the circuit structure 108b in FIGS. 6 and 7 includes any suitable intervening electrical conductor structures (not shown) to interconnect the diodes of the stacked dies 601-604 with the circuits and connections of the base die 600 to provide an output signal of any desired level. In one example, the individual dies 601-604 each generate a voltage signal of approximately 0.6 V, and the stacked dies 601-604 can be interconnected in any desired series and/or parallel configuration to achieve a desired output signal level in response to the light signal from the light source 108a.

Figure 8:
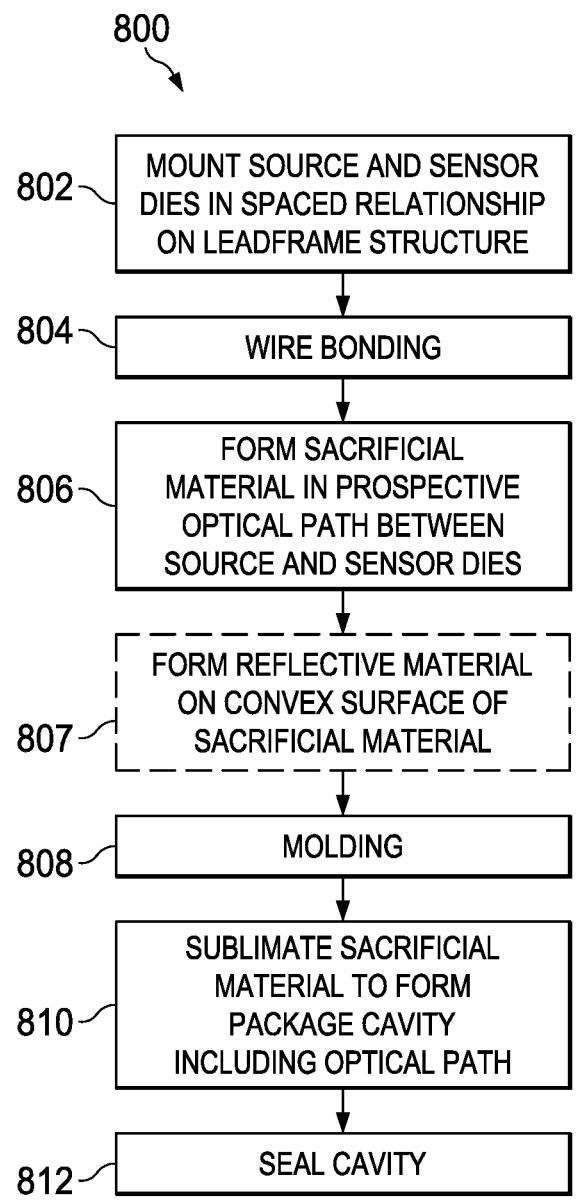
FIG. 8 is a flow diagram of a method to make an integrated circuit according to an embodiment.

FIG. 8 illustrates an example method or process 800 which can be used to fabricate an isolation IC, such as the optical isolation devices described above. The method 800 begins at 802 with mounting of the source and sensor dies in a spaced relationship relative to one another on a leadframe. For example, the first and second circuit structures 106a and 106b can be mounted at 802 to the lead frame structure 104 with the source and sensor faces 107a and 107b spaced from one another by the desired gap distance 116 in FIG. 1 described above. Moreover, in the above example, the second semiconductor die 106b is mounted on the leadframe structure 104b at 802 such that the sensing face 107b of the light sensor 108b at least partially faces the optical path to receive the light signal from the light source 108a. A wire bonding process is performed at 804 in FIG. 8, including connecting bond wires 124 between the die pads 122 and the corresponding lead frame electrical conductors 104a and 104b in FIG. 1. Other necessary bond wires (e.g., 710) can be attached at 804, such as from the base dies 400, 600 to one or more stacked dies 401, 402, 601-604 in the examples of FIGS. 4-7 described above. Solder balls or other IC connection technologies can also be used instead of or in addition to wire bonds. At 806, a sacrificial material is formed over at least part of the assembly in a prospective optical path between the source and sensor dies. The sacrificial may be formed at least partially over a portion of one or both of the first and second semiconductor dies 106a, 106b in some examples at 806. Moreover, in some implementations, the sacrificial material SL is formed at 806 as a drop having a convex surface. In one example, a reflective material is formed at 807 in FIG. 8 on the convex surface of the sacrificial material (e.g., reflective material 200 in FIG. 2 above).

At 808 in FIG. 8, a molding process is performed in order to form a molded package material (e.g., material 102 above) over the semiconductor dies 106, the bond wires 124 and over portions of the leadframe structure 104 and the sacrificial material to create a molded package structure 102. For implementations using a reflective material formed over all or a portion of the sacrificial material layer, the package material is formed at 808 at least partially on the reflective material 200. At 810, the sacrificial material is sublimated to create an internal cavity (e.g., cavity 110 above) defined by an interior surface of the package structure 102. In the above IC examples 100, the sublimation process at 810 provides a structure 102 with a cavity 110 including at least a portion of the optical path 114 to allow transmission of the light signal between the light source 108a and the light sensor 108b. At 812, in some examples, the cavity 110 is sealed. For example, the seal structure 120 is mounted over the port 118 at 812 in the example of FIG. 1 in order to seal the cavity 110 from the exterior of the IC 100.

Figure 9:
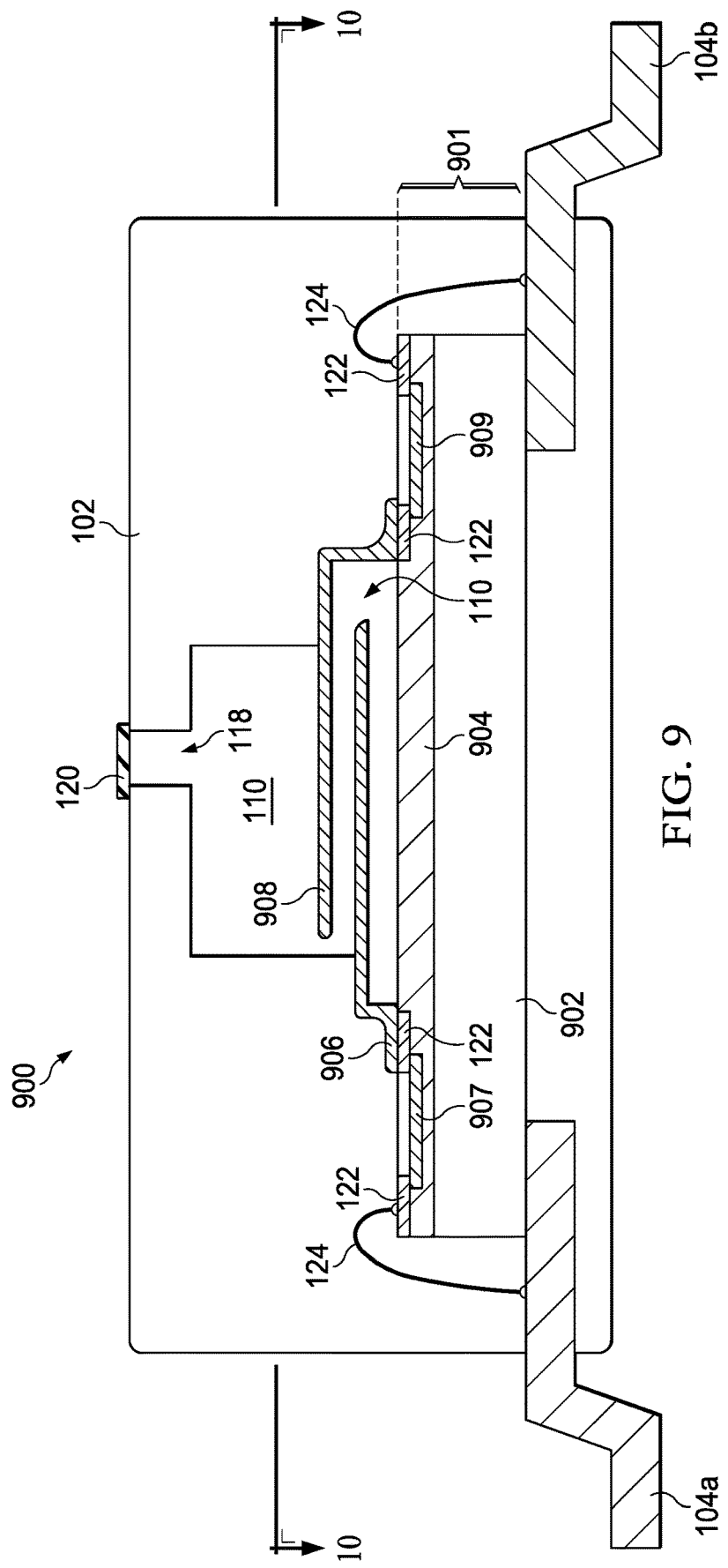
FIG. 9 is a partial sectional side elevation view of a transformer integrated circuit including coil sections extending in an internal cavity of a molded package structure according to another embodiment.
Figure 10:
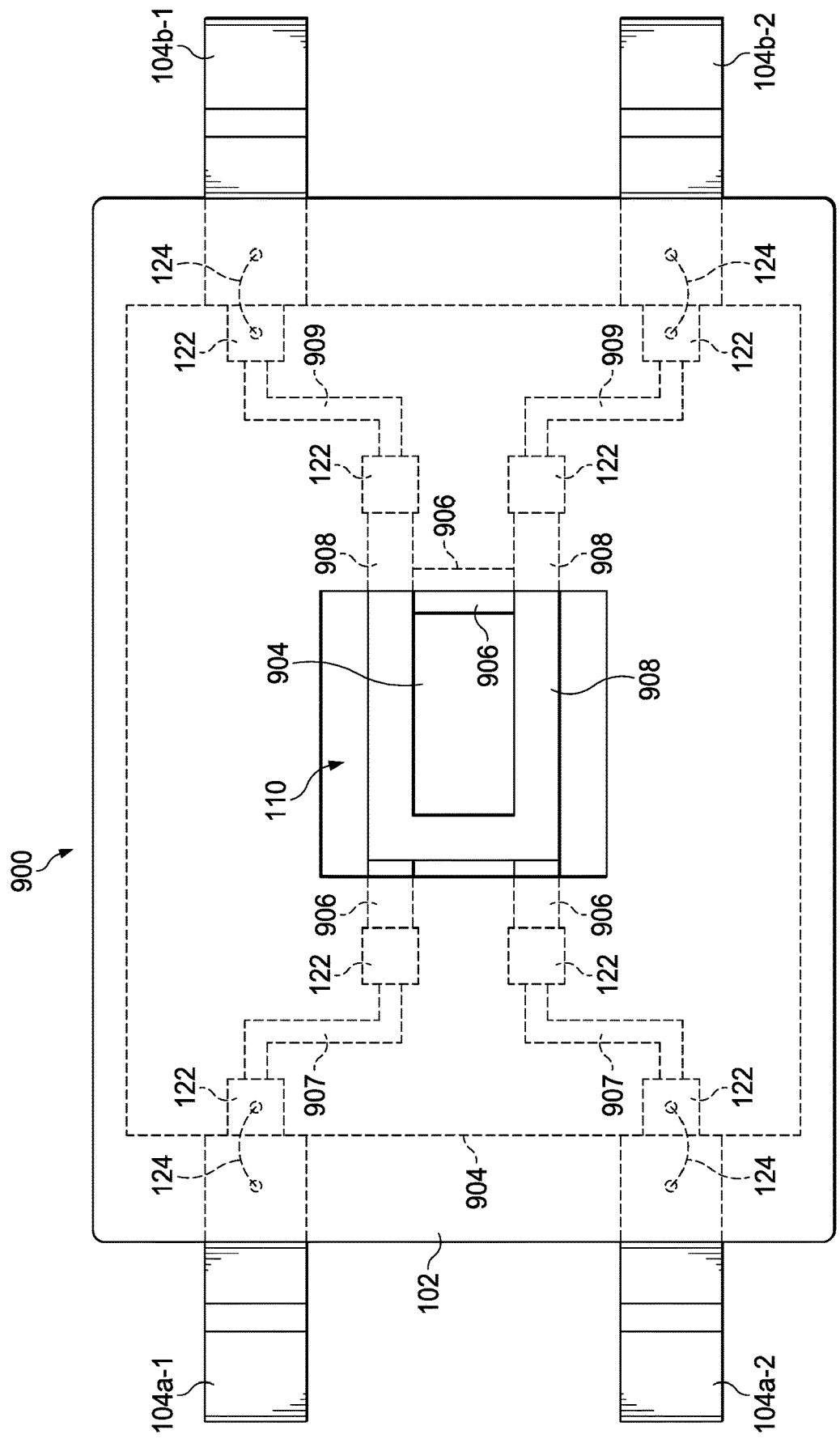
FIG. 10 is a sectional top plan view of the transformer IC of FIG. 9.
Figure 17:
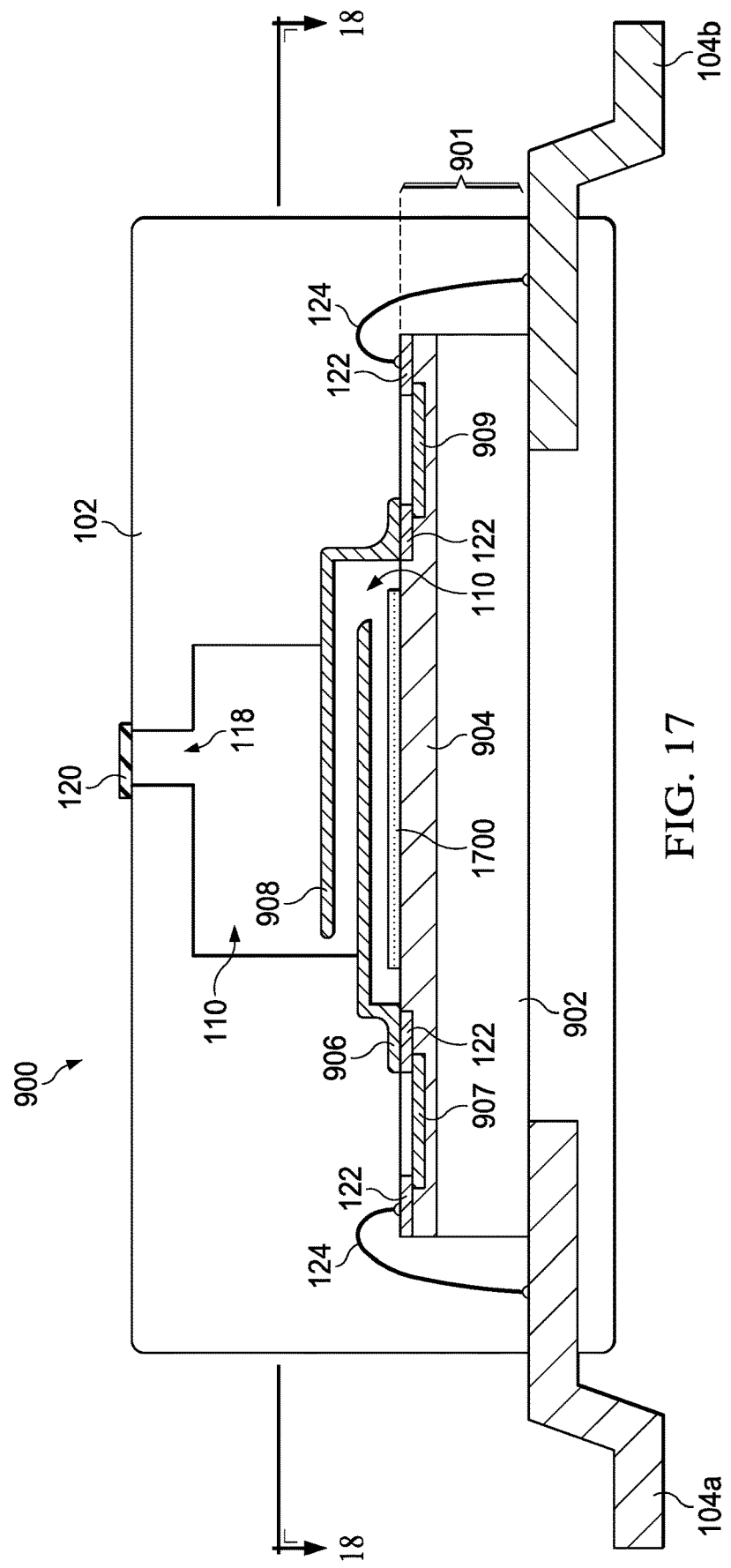
FIG. 17 is a sectional side elevation view of another transformer IC embodiment including coil sections and a ferrous material extending in an internal cavity of the molded package structure.
Figure 18:
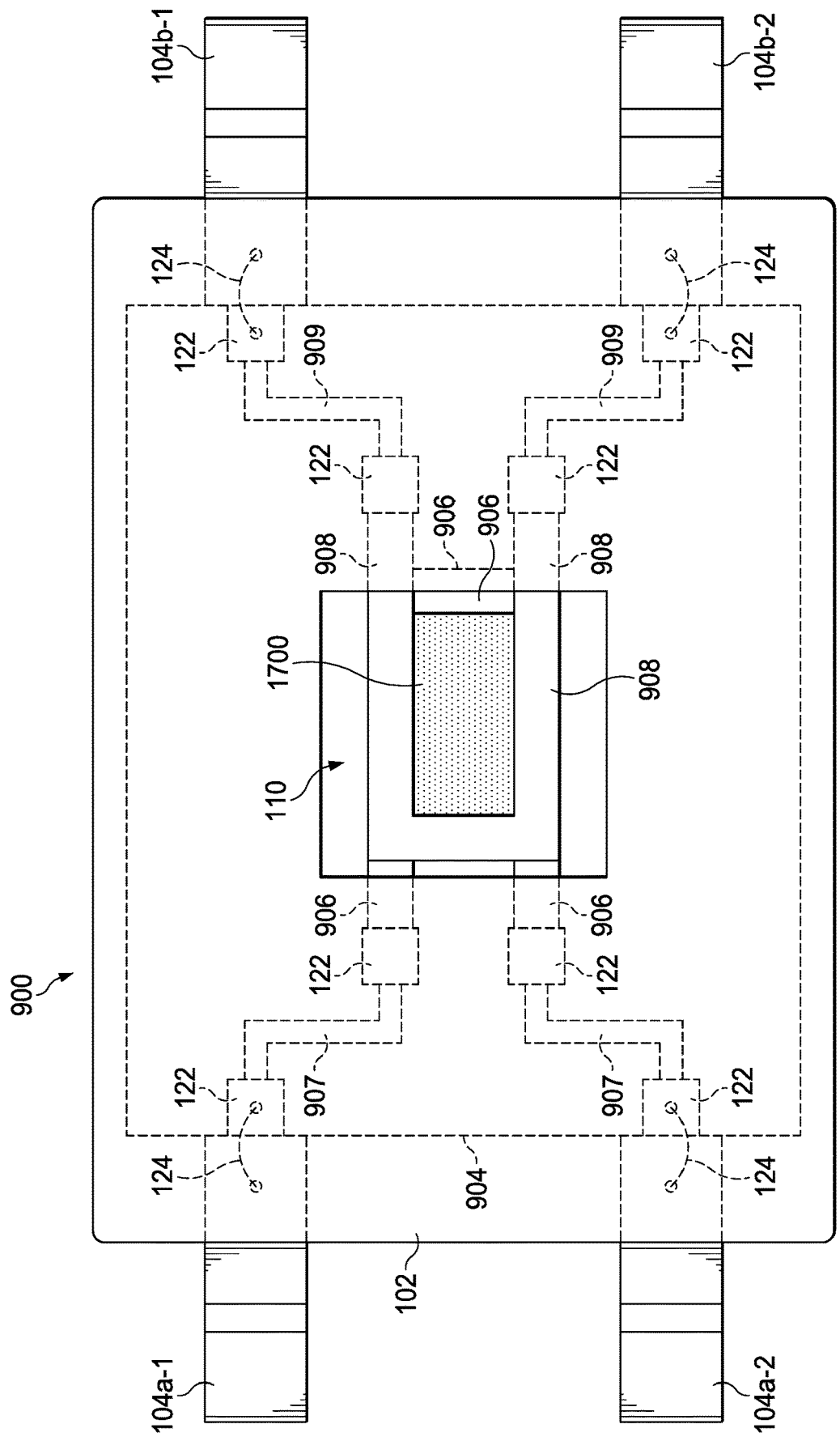
FIG. 18 is a top plan view of the transformer IC embodiment of FIG. 17.

Referring to FIGS. 9-19, magnetically coupled isolation ICs 900 are provided according to further embodiments. FIGS. 9 and 10 illustrate a transformer IC 900 that includes transformer primary and secondary coil sections 906 and 908 extending in an internal cavity 110 of a molded package structure 102. FIGS. 11-16 illustrate the IC 900 of FIGS. 9 and 10 at various stages of fabrication according to a fabrication process 1900 shown in FIG. 19. FIGS. 17 and 18 illustrate an alternate embodiment that further includes a ferrous material 1700 in the package structure cavity 110. In various possible embodiments, transformer isolation devices are provided including two or more coil structures. The coil structures in some examples are constructed from conventional wire. In other examples, the coils are etched using PC board technology. In further examples, such as shown in FIGS. 9 and 10, the coil structures are printed using suitable targeted printing deposition techniques. In the illustrated examples, sacrificial sublimation material is used during intermediate fabrication steps, and then sublimated using suitable processes, such as those described above. In some examples, a powdered ferrite or other core material is included with the sublimation material for enhanced magnetic coupling between the primary and secondary coil structures 906 and 908. Described examples advantageously position the secondary coil field away from the silicon substrate 902 of a semiconductor die structure 901. This reduces eddy-current losses, and the air-core structure resulting from the magnetic coupling in the cavity 110 facilitates reduction in capacitive loss to enhance high-frequency operation and reduce coupling from high slew-rate common-mode signals. Moreover, as shown in the illustrated examples, the coil structures 906, 908 can be at least partially mechanically supported by the molded package structure 102 by selective location of the sacrificial material to at least partially overlie the coil structures 906, 908 before molding. In other examples, the coil structures are at least partially mechanically supported by spacer materials formed before deposition of the sacrificial material.

The IC 900 in the example of FIG. 9 includes a leadframe structure with electrical conductors 104a and 104b as described above. A transformer primary circuit in this example is formed by a first coil structure 906 electrically connected to a first pair of leadframe electrical conductors 104a-1 and 104a-2. The first coil structure 906 is partially formed on the semiconductor die structure 901 through a printing process, and also extends over the first sacrificial material (not shown in FIGS. 9 and 10) such that a portion of the resulting first coil structure 906 extends within the prospective cavity 110 after the sublimation processing. Moreover, in the example of FIG. 9, the first coil structure 906 is formed at least partially over (i.e., in electrical contact with) a die pad or other conductive structure 122 formed in passivated, IMD/metallization structure 904 of the semiconductor die 901. The metallization structure 904 in this example further includes a conductive structure 907 to electrically connect a first end of the first coil structure 906 to an outer die pad 122 that is wire bonded to a corresponding lead frame electrical conductor 104a. A second end of the coil structure 906 is connected by a second conductive structure 907 to a second lead frame electrical conductor 104a. As shown in the top view of FIG. 10, the first coil structure 906 forms a turn inside the cavity 110 between the first and second ends. Coil structures 906 and 908 may also be spirals with multiple concentric turns.

The second coil structure 908 in this example forms a transformer secondary circuit having two ends that are electrically connected to a second pair of the leadframe electrical conductors 104b-1 and 104b-2 via metallization structure conductors 909, corresponding die pads 122 and associated bond wires 124. The second coil structure 908 in this example is formed by a printing deposition process, and includes ends that extend partially on the semiconductor die structure 901 to form electrical connection to corresponding die pads 122. Other examples are possible using two die, one for the primary and one for the secondary. The described techniques can also be used in other embodiments to manufacture an isolation transformer with an air dielectric inside an IC package without an IC die to provide a standalone transformer. The second coil structure 908 extends into the cavity 110 and forms a turn extending at least partially over the first coil structure 906 within the cavity 110. By this configuration, the first and second coil structures 906 and 908 are magnetically coupled with one another via the air or other gas within the cavity 110 to constitute an air-core transformer in some examples. As with the optical isolation device 100 described above, the cavity 110 in the transformer example 900 of FIG. 9 includes a port or opening 118, which is covered by a seal structure 120 in some examples. The IC 900 includes a package structure 102 as generally described above, that encloses portions of the leadframe structure 104 and the bond wires 124, while exposing portions of the lead frame electrical conductors 104a-1, 104a-2, 104b-1, 104b-2 to allow external connection to the first and second coil structures 906, 908.

FIGS. 17 and 18 illustrate an alternate transformer IC embodiment 900, including first and second coil sections 906 and 908 as generally described above. The Example of FIGS. 17 and 18 further includes a ferrous material 1700 extending at least partially in the cavity 110. As shown in FIG. 17, the ferrous material 1700 can be formed on the structure 904 of the semiconductor die structure 901, spaced from and below a portion of the first coil structure 906 and the second coil structure 908. Moreover, in this example, the ferrous material 1700 extends at least partially in the cavity 110. In operation, the ferrous material 1700 facilitates magnetic coupling of the first and second coil structures 906 and 908. In other possible implementations, a ferrous material 1700 can be formed at different locations, at least partially within the cavity 110. In one possible implementation, a ferrous material structure 1700 can be formed vertically between, and spaced from, the first and second coil structures 906, 908 to further enhance magnetic coupling of the coils. For example, a ferrous material layer 1700 can be formed over a corresponding sacrificial material layer above the first coil structure 906 before formation of the second coil structure 908, and the second coil structure 908 can be formed over a further sacrificial material layer formed on the ferrous material 1700, which further sacrificial material layer exposes at least a portion of the deposited ferrous material structure 1700. In such an example, subsequent molding of the package material 102 and sublimation of the sacrificial material layers leaves a ferrous material structure 1700 at least partially mechanically supported by the molded material 102, and which extends vertically between, and spaced from, the coil structures 906 and 908. Multiple ferrous material layers can also be used at the same or different locations with respect to the coil structures.

Figure 11:
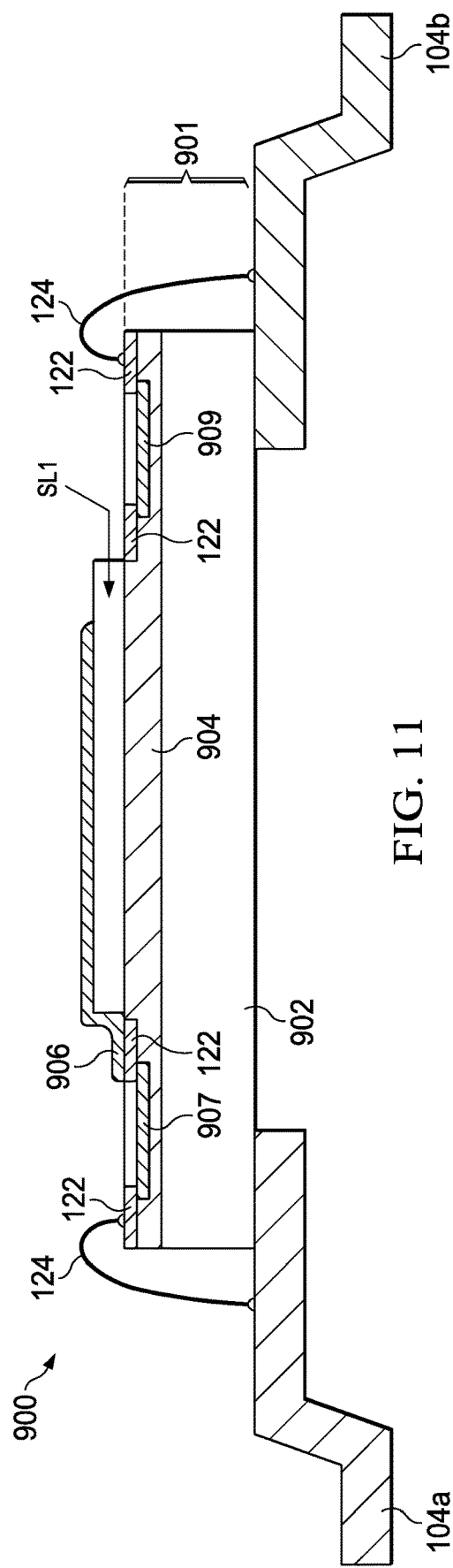
FIGS. 11-16 are sectional side elevation views of the IC of FIGS. 9 and 10 at various stages of fabrication.

Referring to FIGS. 11-19, FIG. 19 illustrates a process or method 1900 to make an integrated circuit according to another embodiment. For example, the process 1900 is useful to fabricate the transformer IC examples 900 of FIGS. 9, 10, 17 and/or 18 as described above. The method 1900 begins at 1902 with mounting of one or more semiconductor dies on a leadframe structure. For example, the semiconductor die structure 901 in FIG. 9 or FIG. 17 can be mounted to a leadframe structure including leadframe electrical conductors 104, as shown in FIG. 11. At 1904 in FIG. 19, a wire bonding process is performed to connect bond wires 124 between die pads 122 of the semiconductor die structure 901 and the leadframe electrical conductors 104 as shown in FIG. 11. In some examples, a ferrous material 1700 may be formed at 1905 for a transformer core, over a portion of the semiconductor die 901 before forming a first sacrificial material layer (e.g., as shown in FIG. 17). At 1906, a first sacrificial material is formed over a portion of the semiconductor die 901 (e.g., directly or over an intervening ferrous material layer 1700). The first and subsequent sacrificial material layers can be formed by any suitable deposition process. In FIG. 11, the first sacrificial layer is shown as layer SL1. In this example, the first sacrificial material layer SL1 is formed over a middle portion of the upper surface of the die structure 901 at 1906, and the layer SL1 does not cover the illustrated die pads 122 formed in the structure 904.

Figure 12:
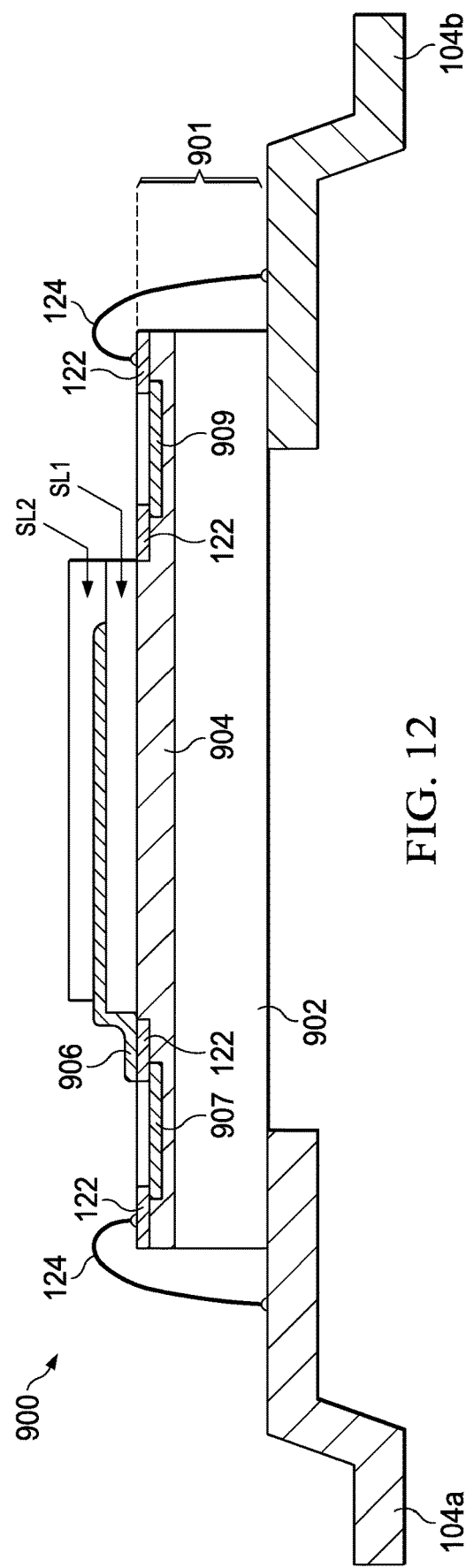
Figure 13:
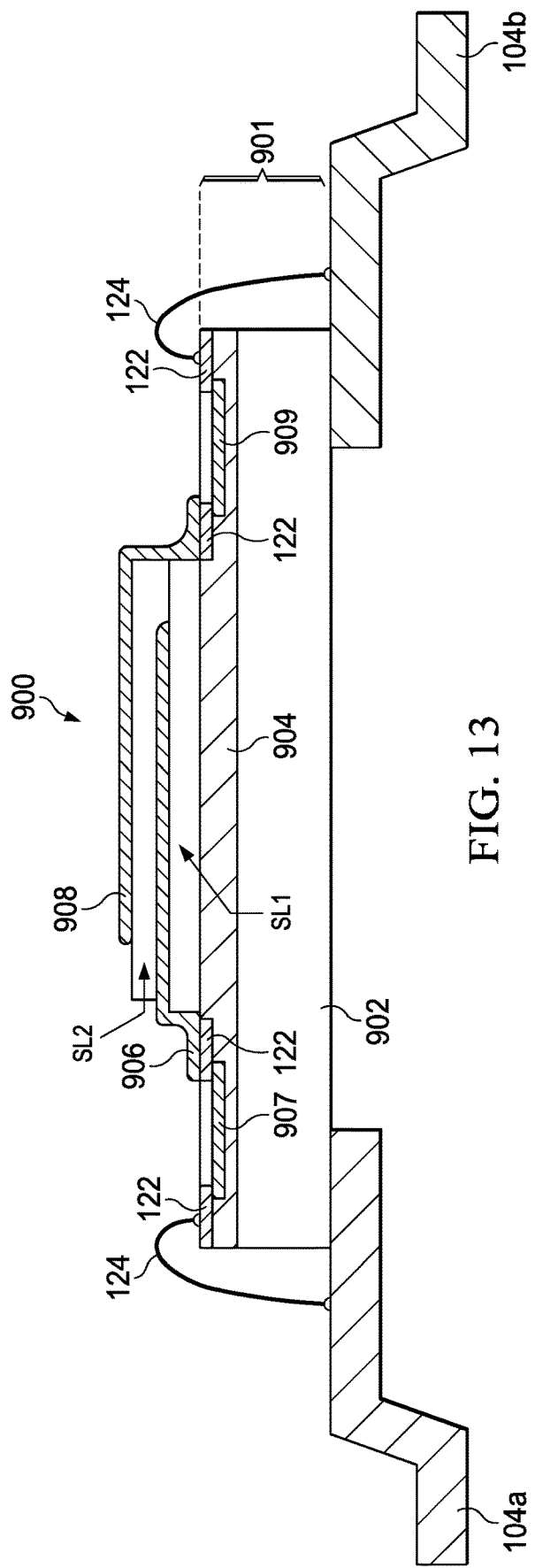
Figure 19:
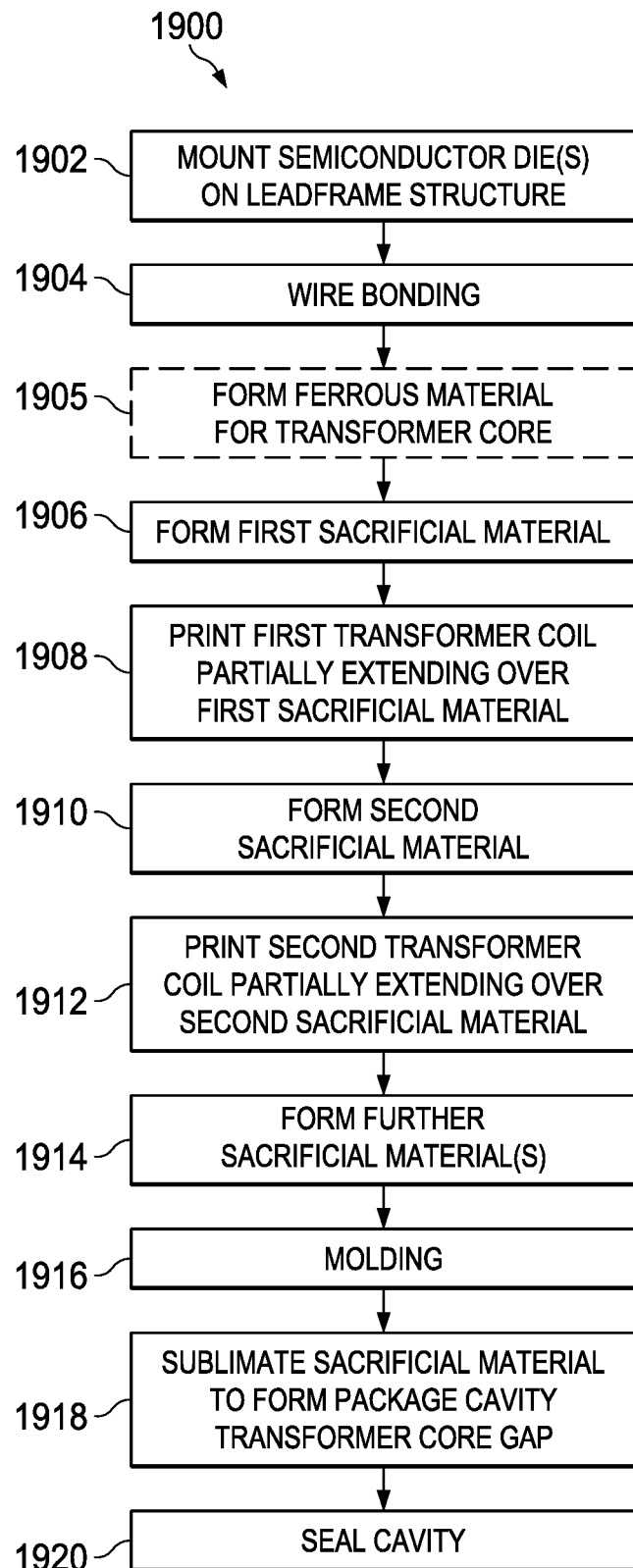
FIG. 19 is a flow diagram of a method to make an integrated circuit according to another embodiment.

At 1908 in FIG. 19, a first coil structure (e.g., 906 above) is formed at least partially on the first sacrificial material layer SL1. In the example of FIG. 11, the coil structure 906 is formed at least partially over a die pad 122 of the semiconductor die structure 9014 electrical connection to the first pair of the electrical conductors 104a-1, 104a-2 of the leadframe structure by the wire bonding processing at 1904. In one example, a printing type deposition process is used at 1908 to print the first transformer coil structure 906. At 1910 in FIG. 19, a second sacrificial material layer SL2 is formed over a portion of the first coil structure 906. FIG. 12 shows an example in which a second material layer SL2 is formed over a portion of the first sacrificial material layer SL1 and over a portion of the previously formed first coil structure 906. At 1912 in FIG. 19, a second coil structure 908 is formed partially on the second sacrificial material layer SL2. As shown in FIG. 13, in one example, the second coil structure 908 is formed using a printing process to extend at least partially over the second sacrificial material layer SL2 and over a corresponding died pad 122 of the semiconductor die structure 9014 electrical connection through bond wires 124 to the second pair of leadframe electrical conductors 104b-1 and 104b-2.

Figure 14:
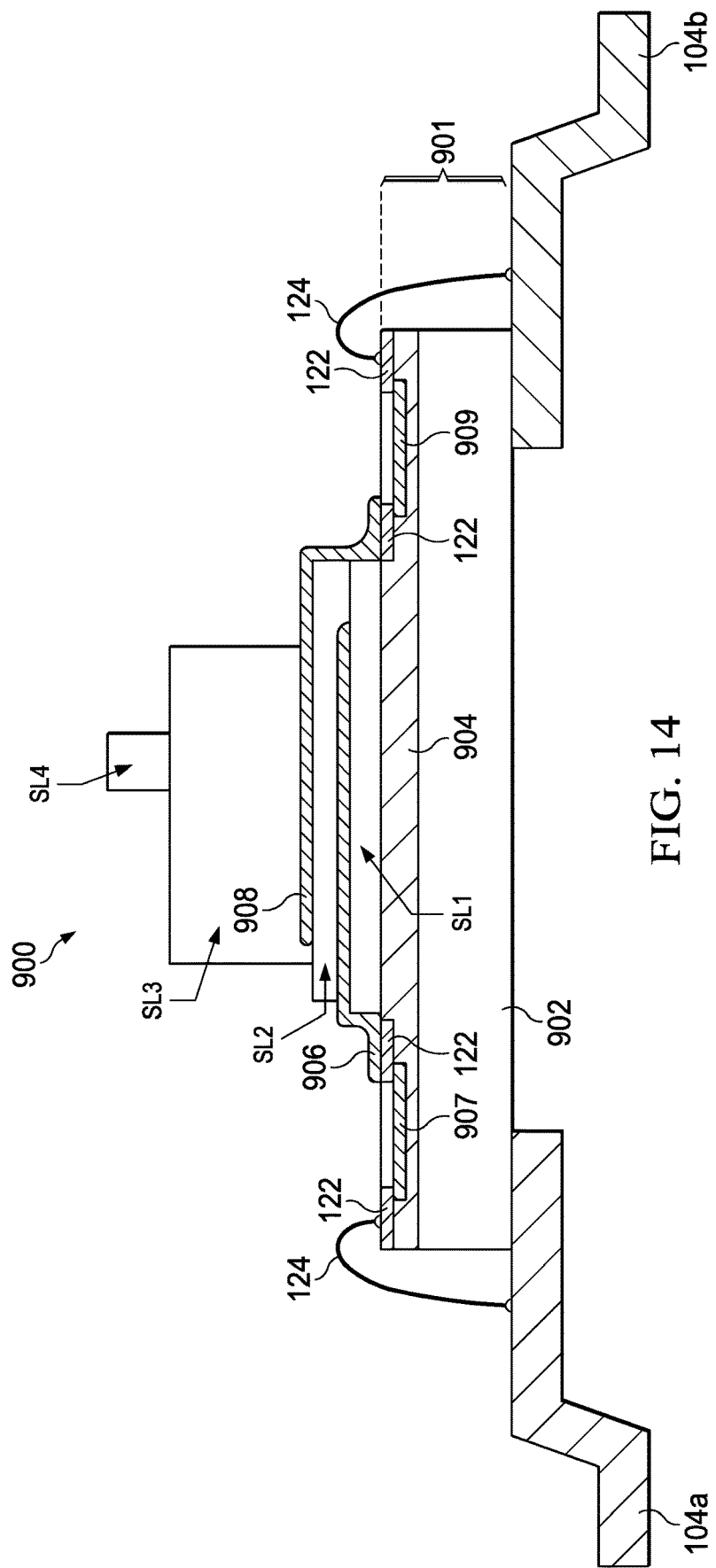
Figure 15:
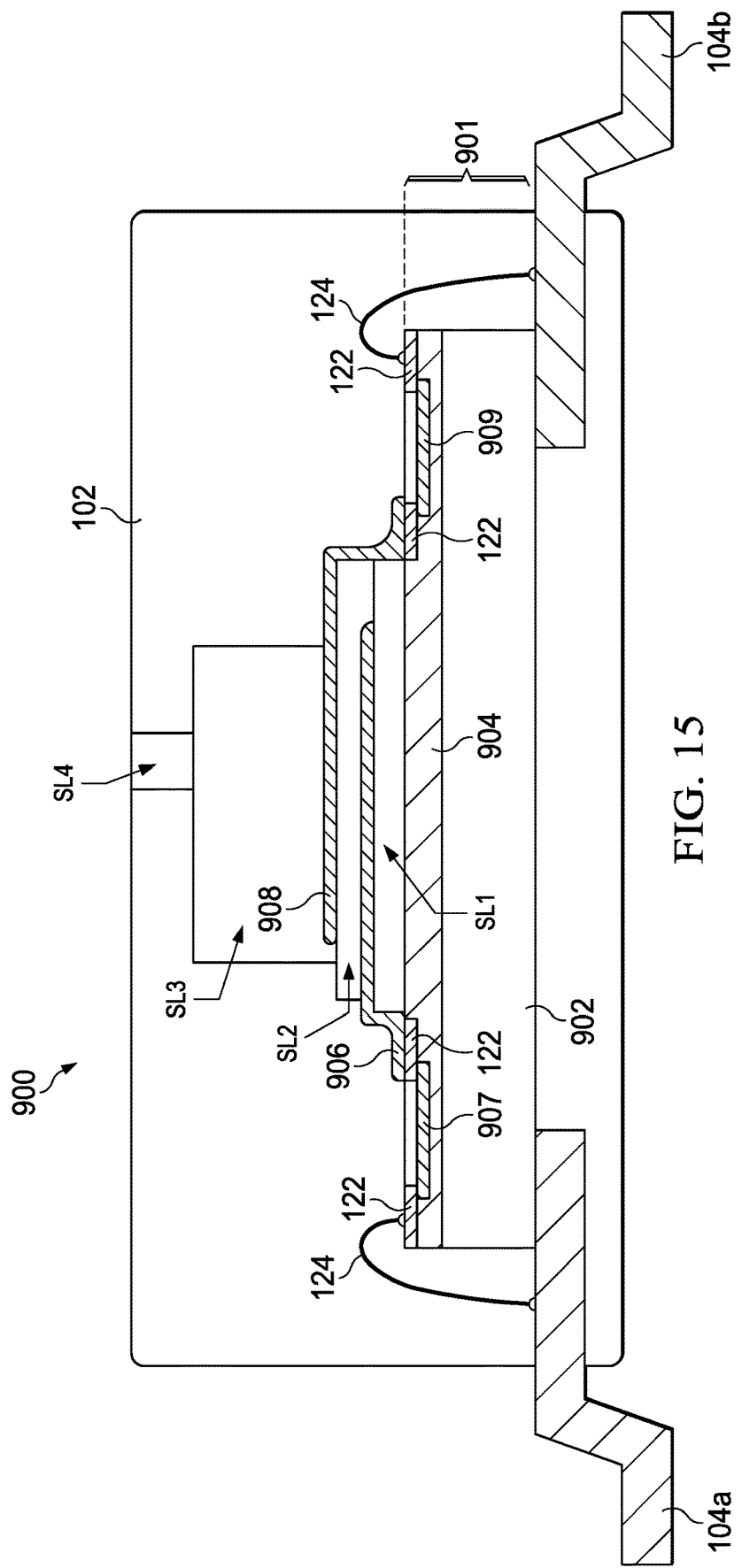
Figure 16:
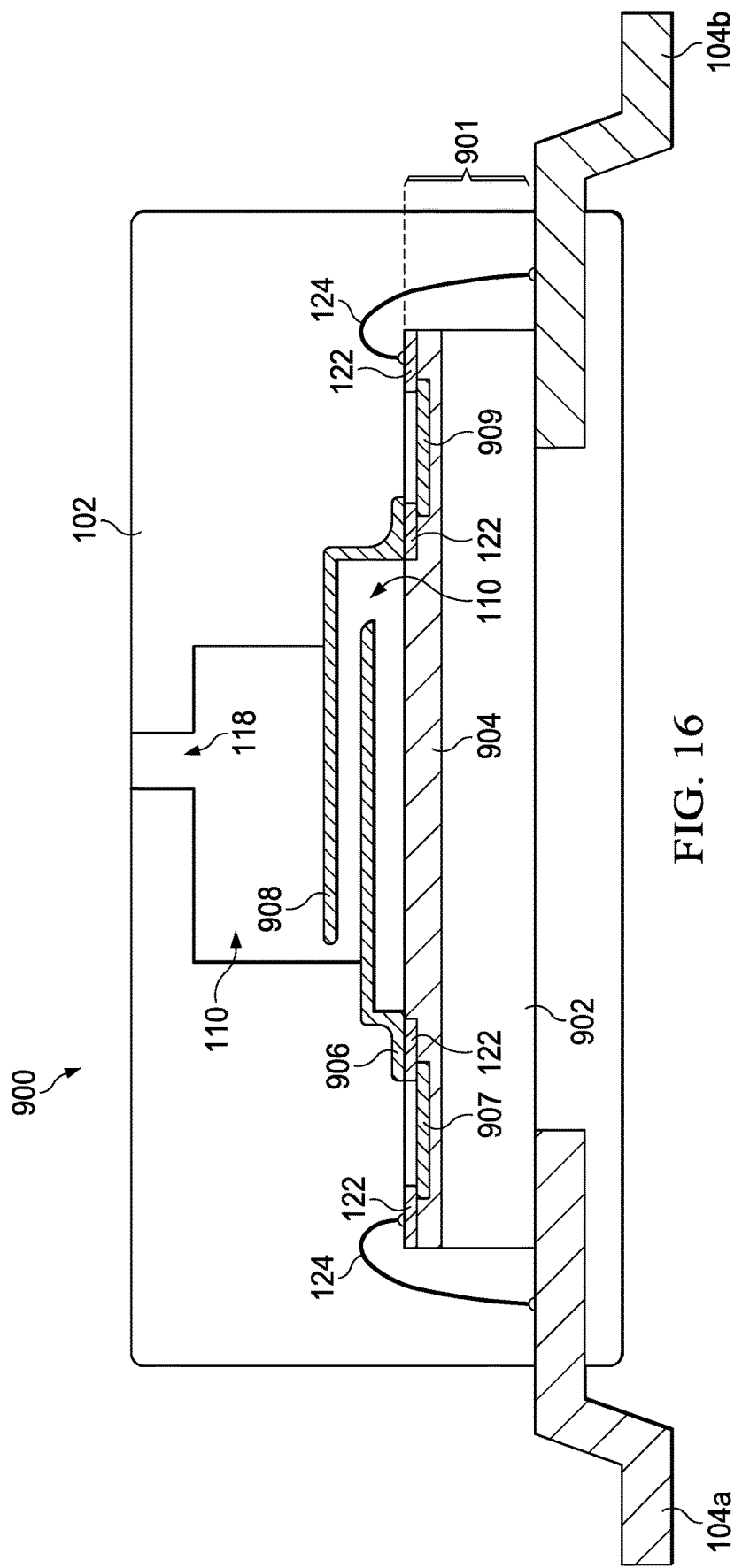

Continuing at 1914 in FIG. 19, one or more further sacrificial material layers are formed. In the example of FIG. 14, a third sacrificial layer SL3 is formed to define the upper section of the prospective cavity 110 (e.g., FIG. 9), and thereafter a fourth sacrificial material layer SL4 is formed in order to define the prospective port opening 118 (e.g., FIG. 9). More or fewer sacrificial layers can be formed at 1914 in various implementations. At 1916, a molding process is performed to form a package material (e.g., 102 in FIG. 15) over the semiconductor die 901, the bond wires 124 and over portions of the leadframe structure 104 and the sacrificial material layers to create a molded package structure 102. Moreover, as shown in FIG. 15, the molded package material 102 is formed in some examples at least partially over one or both of the coil structures 906 and/or 908 for subsequent structural support thereof after sublimation of the sacrificial material layers. At 1918, the sacrificial material SL is sublimated to create an internal cavity 110 defined by an interior surface of the package structure 102, as shown for example in FIG. 16. The resulting internal cavity 110 includes at least a portion of an electrical isolation barrier between first and second coil structures 906 and 908, and also at least partially provides an air-core to magnetically couple the coil structures 906, 908 in some examples. Moreover, in some examples, the cavity is sealed at 1920 in FIG. 19, such as by forming the seal structure 120 over the port 118 in the transformer ICs 900 of FIGS. 9, 10, 17 and 18 described above.

Modifications are possible in the described embodiments, and other embodiments are possible, within the scope of the claims.

What is claimed is:

1. An integrated circuit, comprising:
a leadframe structure, including electrical conductors;
a first coil structure electrically connected to a first pair of the electrical conductors of the leadframe structure, the first coil structure partially formed on a semiconductor die structure;
a second coil structure electrically connected to a second pair of the electrical conductors of the leadframe structure, the second coil structure partially formed on the semiconductor die structure; and
a molded package structure enclosing portions of the leadframe structure, the molded package structure exposing portions of the first and second pairs of the electrical conductors to allow external connection to the first and second coil structures, the molded package structure including a cavity to magnetically couple portions of the first and second coil structures.

2. The IC of claim 1, wherein the cavity is sealed.

3. The IC of claim 1, wherein portions of the first and second coil structures extend in the cavity.

4. The IC of claim 3, wherein the molded package structure encloses portions of the first and second coil structures.

5. The IC of claim 4, further comprising a ferrous material extending at least partially in the cavity.

6. The IC of claim 1, wherein the molded package structure encloses portions of the first and second coil structures.

7. The IC of claim 1, further comprising a ferrous material extending at least partially in the cavity.

8. The IC of claim 7, wherein the ferrous material is formed on the semiconductor die structure.

* * * * *